US012777963B2

(12) United States Patent
Chang et al.

(10) Patent No.: US 12,777,963 B2
(45) Date of Patent: Oct. 27, 2026

(54) SEMICONDUCTOR PACKAGE WITH STIFFENER STRUCTURE

(71) Applicant: Taiwan Semiconductor Manufacturing Company, Ltd., Hsinchu (TW)

(72) Inventors: Chieh-Ming Chang, New Taipei City (TW); Chia-Kuei Hsu, Hsinchu City (TW); Ming-Chih Yew, Hsinchu City (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 440 days.

(21) Appl. No.: 18/460,855

(22) Filed: Sep. 5, 2023

(65) Prior Publication Data

US 2025/0079246 A1 Mar. 6, 2025

(51) Int. Cl.

| | |
|---|---|
| ***H10W 76/40*** | (2026.01) |
| ***H10W 40/25*** | (2026.01) |
| ***H10W 70/685*** | (2026.01) |
| ***H10W 90/00*** | (2026.01) |
| *H10W 72/00* | (2026.01) |
| *H10W 74/15* | (2026.01) |
| *H10W 76/17* | (2026.01) |

(52) U.S. Cl.

CPC ......... *H10W 76/40* (2026.01); *H10W 40/258* (2026.01); *H10W 70/685* (2026.01); *H10W 90/00* (2026.01); *H10W 72/0198* (2026.01); *H10W 72/877* (2026.01); *H10W 74/15* (2026.01); *H10W 76/17* (2026.01); *H10W 90/724* (2026.01); *H10W 90/734* (2026.01); *H10W 90/736* (2026.01)

(58) Field of Classification Search

CPC ................................ H01L 23/16; H10W 76/40

See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |

(Continued)

*Primary Examiner* — Brent A. Fairbanks
*Assistant Examiner* — Krishna J Palaniswamy
(74) *Attorney, Agent, or Firm* — McClure, Qualey & Rodack, LLP

(57) ABSTRACT

A chip package structure is provided. The chip package structure includes a semiconductor die formed over a package substrate and an interconnect structure bonded and electrically connected between the semiconductor die and the package substrate. The chip package structure also includes a stiffener structure formed over the package substrate and covering the semiconductor die. The metal stiffener structure has a metal lid cap portion covering the upper surface of the semiconductor die, a metal ring portion surrounding the metal lid cap portion, and a metal spacer wall portion extending between the metal ring portion and the package substrate to surround the semiconductor die.

20 Claims, 18 Drawing Sheets

(56) References Cited

U.S. PATENT DOCUMENTS

| | | | | |
|---|---|---|---|---|
| 9,735,131 | B2 | 8/2017 | Su et al. | |
| 2010/0276799 | A1* | 11/2010 | Heng .................... | H10W 40/10<br>438/118 |
| 2011/0018125 | A1* | 1/2011 | Loo ....................... | H10W 40/10<br>257/E23.101 |
| 2021/0305227 | A1* | 9/2021 | Chen ..................... | H10W 40/22 |
| 2021/0407887 | A1* | 12/2021 | Yu ......................... | H10W 40/22 |

* cited by examiner

SEMICONDUCTOR PACKAGE WITH STIFFENER STRUCTURE

BACKGROUND

In the semiconductor industry, semiconductor devices and integrated circuits are typically manufactured on a single semiconductor wafer simultaneously. The semiconductor chips/dies are then sawed from the wafer. The semiconductor dies of the wafer may be processed and packaged with other semiconductor devices or dies at the wafer level, and various technologies have been developed for the wafer level packaging.

In the packaging of integrated circuits, semiconductor dies may be stacked and bonded to other package components (e.g., interposer substrates and package substrates). However, since semiconductor chips are typically small and fragile, it is desirable to provide a more reliable stiffener structure (e.g., lid) for use with IC packages.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
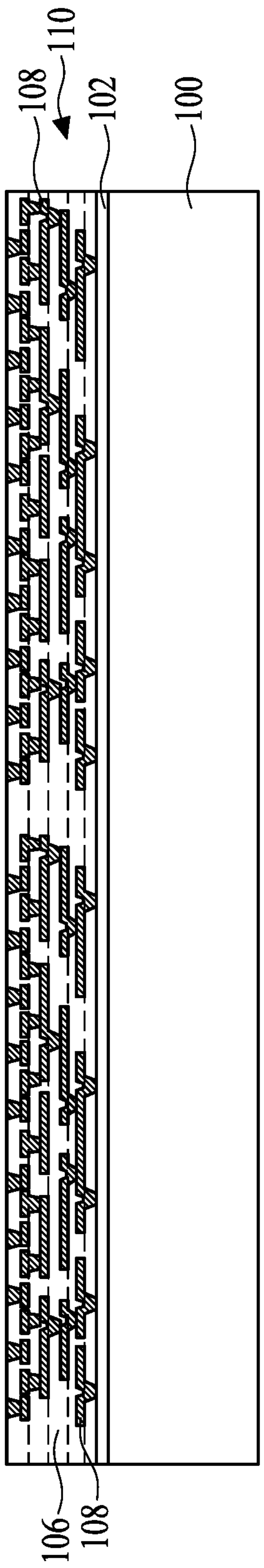
FIGS. 1A to 1J are cross-sectional views of various stages of a method for forming a chip package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. FIGS. 1A to 1J are cross-sectional views of various stages of a process for forming a chip package structure 20*a*, in accordance with some embodiments. Additional operations can be provided before, during, and/or after the stages described in FIGS. 1A to 1J. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, an interconnect structure 110 is formed over a carrier substrate 100 in accordance with some embodiments. For example, the interconnect structure 110 is an interposer substrate. The interposer substrate is attached onto the carrier substrate 100 via a de-bonding layer 102. More specifically, the carrier substrate 100 may be a glass carrier substrate, a ceramic carrier substrate or any suitable carrier substrate for carrying a semiconductor wafer for the manufacturing method of the chip package structure. The de-bonding layer 102 may include a light-to-heat conversion (LTHC) layer or an adhesive layer (such as a ultra-violet curable adhesive or a heat curable adhesive layer). The de-bonding layer 102 is decomposable under the heat of light, so as to remove the carrier substrate 100 from the overlying structure (e.g., the interconnect structure 110) in the subsequent steps.

In some embodiments, the interposer substrate includes a redistribution layer (RDL) structure 108 that is formed in a base layer 106 that is attached onto the carrier substrate 100 via the de-bonding layer 102. The RDL structure 108 may be used as a fan-out RDL structure for routing. More specifically, the RDL structure 108 includes one or more conductive layers (such as two or three conductive layers) embedded within one or more dielectric layers (which form the base layer 106). The RDL structure 108 provides not only conductive routing for signals, but may also provide structures such as integrated inductors or capacitors. In some embodiments, the dielectric layers include an organic material such as polybenzoxazole (PBO), polyimide (PI), one or more other suitable polymer materials, or a combination thereof. In those cases, the interposer substrate is also referred to as an organic substrate or an organic interposer. The dielectric layers may be formed by, for example, a spin-coating process, although any suitable method may be used.

Multiple deposition, coating, and/or etching processes may be used to form the interposer substrate including the RDL structure 108 and the base layer 106. After the first of the dielectric layers has been formed, openings (not shown) may be made through the first dielectric layer. Once the first dielectric layer has been formed and patterned, the first of the conductive layers (such as copper) is formed over the first dielectric layer and through the openings that were formed within the first dielectric layer. In some embodiments, the first conductive layer is formed using a suitable formation process, such as electroplating, chemical vapor deposition (CVD) or sputtering. However, while the material and methods discussed are suitable to form the conductive layer, this material is merely exemplary. Any other suitable materials, such as aluminum, tungsten, nickel, titanium, gold, platinum, silver, another suitable material, or a combination thereof, and any other suitable processes of formation, such as CVD or physical vapor deposition (PVD), may be used to form the conductive layers.

Once the first conductive layer has been formed, a second dielectric layer and a second conductive layer may be formed by repeating steps that are similar to the steps for the first dielectric layer and first conductive layer. These steps may be repeated as desired in order to form an electrical connection between the conductive layers. In some embodiments, the deposition and patterning of the conductive layers and the dielectric layers may be continued until the RDL structure 108 has the desired number of conductive layers. Bond pads (not shown) may be formed over the RDL structure 108.

Figure 1B:
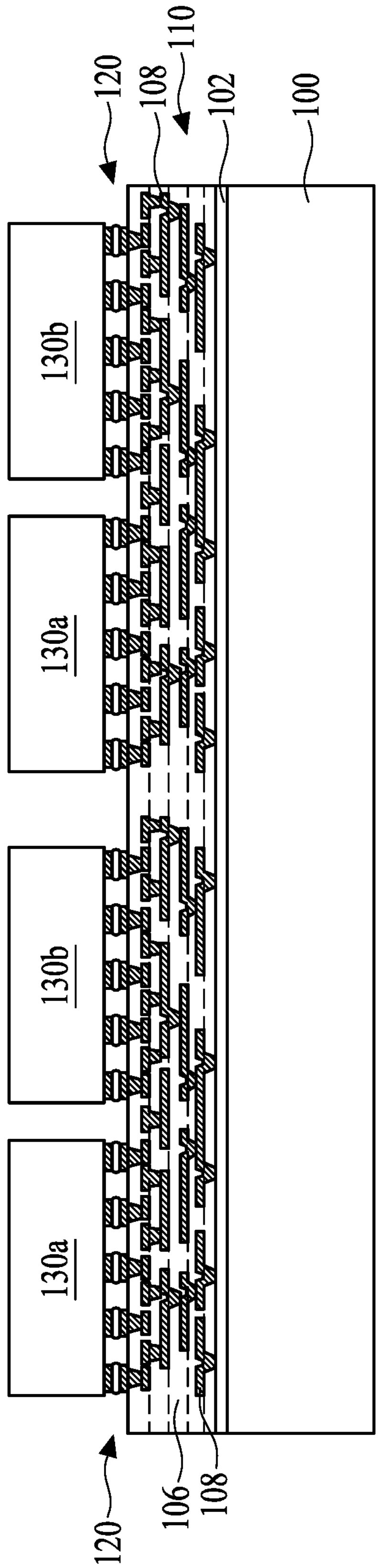

After the interconnect structure 110 is provided, semiconductor dies 130*a* and 130*b* are placed over the interconnect structure 110 using, for example, a pick and place tool (not shown) and then the semiconductor dies 130*a* and 130*b* are mounted over the interconnect structure 110 via the bump structures (e.g., microbumps) 120, as shown in FIG. 1B in accordance with some embodiments. For example, the microbumps may be solder balls and formed on the bond pads using a ball-mounting head (not shown). The microbumps may be made of a material such as tin, silver, lead-free tin, or copper. The microbumps form bump structures 120 that serves as an electrical connection between the subsequently provided semiconductor dies 130*a* and 130*b* and the interconnector structure 110.

In some embodiments, the semiconductor dies 130*a* and 130*b* are provided by dicing along the scribe lines (not shown) of one or more semiconductor wafers using a sawing process, an etching process, or a combination thereof. In some embodiments, the semiconductor dies 130*a* and 130*b* are homogeneous semiconductor dies and formed by dicing the same semiconductor wafer. For example, the semiconductor wafer may include homogeneous semiconductor dies (which are also referred to as semiconductor chips when sawed apart). The homogeneous semiconductor dies 130*a* and 130*b* may be logic dies or system-on-chip (SoC) dies (which includes multiple functions). The examples of the logic IC die may include a central processing unit (CPU) die, a graphic processing unit (GPU) die, a mobile application die, a micro control unit (MCU) die, an application processor (AP) die), or a memory die (e.g., a high bandwidth memory (HBM) die, an application specific integrated circuit (ASIC) die, a dynamic random access memory (DRAM) die or a static random access memory (SRAM) die), although any suitable semiconductor chip/die may be utilized.

In some other embodiments, the semiconductor dies 130*a* and 130*b* are heterogeneous semiconductor dies and formed by dicing different semiconductor wafers. The heterogeneous semiconductor dies 130*a* may be logic dies or system-on-chip (SoC) dies and the semiconductor dies 130*b* may be logic dies or system-on-chip (SoC) dies. For example, the semiconductor dies 130*a* are ASIC dies and the semiconductor dies 130*b* are HBM dies.

In some embodiments, the semiconductor dies 130*a* and 130*b* are alternately arranged in a side by side manner. In order to simplify the diagram, only two semiconductor dies 130*a* and two semiconductor dies 130*b* are depicted. Optional under bump metallization (UBM) layers (not shown) and the overlying solder bump structures (not shown) may be correspondingly formed on the semiconductor dies 130*a* and 130*b* prior to the placement of the semiconductor die semiconductor dies 130*a* and 130*b*.

After the semiconductor dies 130*a* and 130*b* (e.g., ASIC dies and HBM dies) are placed over the interconnect structure 110, the interconnect structure 110 formed over the carrier substrate 100 is bonded with the semiconductor dies 130*a* and 130*b*.

Figure 1C:
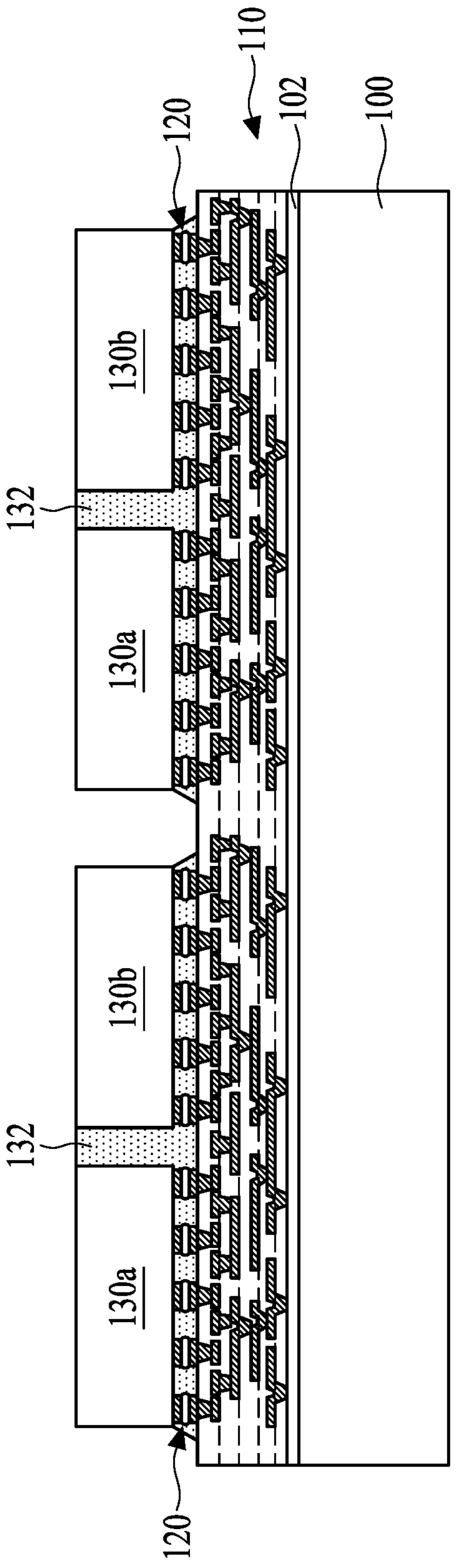
Figure 1D:
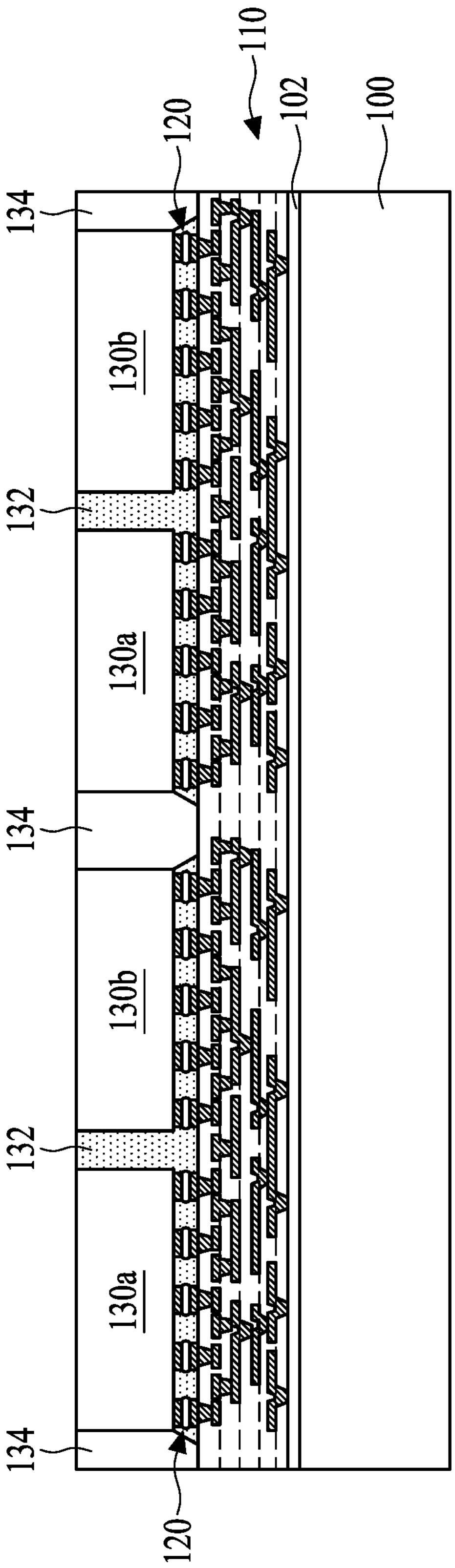

After the semiconductor dies 130*a* and 130*b* are bonded onto the interconnect structure 110, an encapsulating layer (which is also referred to as a package layer) is formed over the interconnect structure 110 to cover the semiconductor dies 130*a* and 130*b*, as shown in FIGS. 1C to 1D in accordance with some embodiments. More specifically, the encapsulating layer includes a first material layer 132 (as shown in FIG. 1C) and a second material layer 134 (as shown in FIG. 1D).

As shown in FIG. 1C, the first material layer 132 is formed to extend between opposite sidewalls of the adjacent semiconductor dies 130*a* and 130*b*, between the interconnect structure 110 and the semiconductor die 130*a*, and between the interconnect structure 110 and the semiconductor die 130*b* in accordance with some embodiments. For example, the first material layer 132 may be made of an underfill material. In those cases, the first material layer 132 is referred to as an underfill material layer. The underfill material layer (e.g., the first material layer 132) is employed to protect and support the semiconductor die from operational and environmental degradation, such as stresses caused by the generation of heat during operation. The underfill material may be made of an epoxy-based resin or other protective material. In some embodiments, the formation of the underfill material layer involves an injecting process, a dispensing process, a film lamination process, one or more other applicable processes, or a combination thereof. In some embodiments, a thermal curing process is then used to cure the underfill material layer.

After the first material layer 132 is formed, the second material layer 134 of the encapsulating layer is formed to surround sidewalls of the adjacent semiconductor dies 130*a* and 130*b*, as shown in FIG. 1D in accordance with some embodiments. The second material layer 134 is made of a material different than that of the first material layer 132. For example, the second material layer 134 is made of a molding compound material. In those cases, the second material layer 134 is referred to as a molding compound layer. The molding compound material layer is formed to encapsulate the first material layer 132 and the semiconductor dies 130*a* and 130*b*. As a result, the sidewalls of the semiconductor dies 130*a* and 130*b* uncovered by the underfill material layer are covered by the second material layer 134. The second material layer 134 may be formed by applying a liquid molding compound material over the interconnect structure 110 and the semiconductor dies 130*a* and 130*b*. Afterwards, a thermal process is then applied to harden the liquid molding compound material. Afterwards, the hardened molding compound material layer is etched back to expose the upper surfaces of the first material layer 132 (e.g., the underfill material layer) and the semiconductor dies 130*a* and 130*b*, as shown in FIG. 1D in accordance with some embodiments. For example, a planarization process may be used to thin the hardened molding compound material layer (e.g., the second material layer 134). The planarization process may include a grinding process, a chemical mechanical polishing (CMP) process, an etching process, another applicable process, or a combination thereof. As a result, the upper surfaces of the second material layer 134, the first material layer 132, and the semiconductor dies 130*a* and 130*b* are substantially level with each other.

Figure 1E:
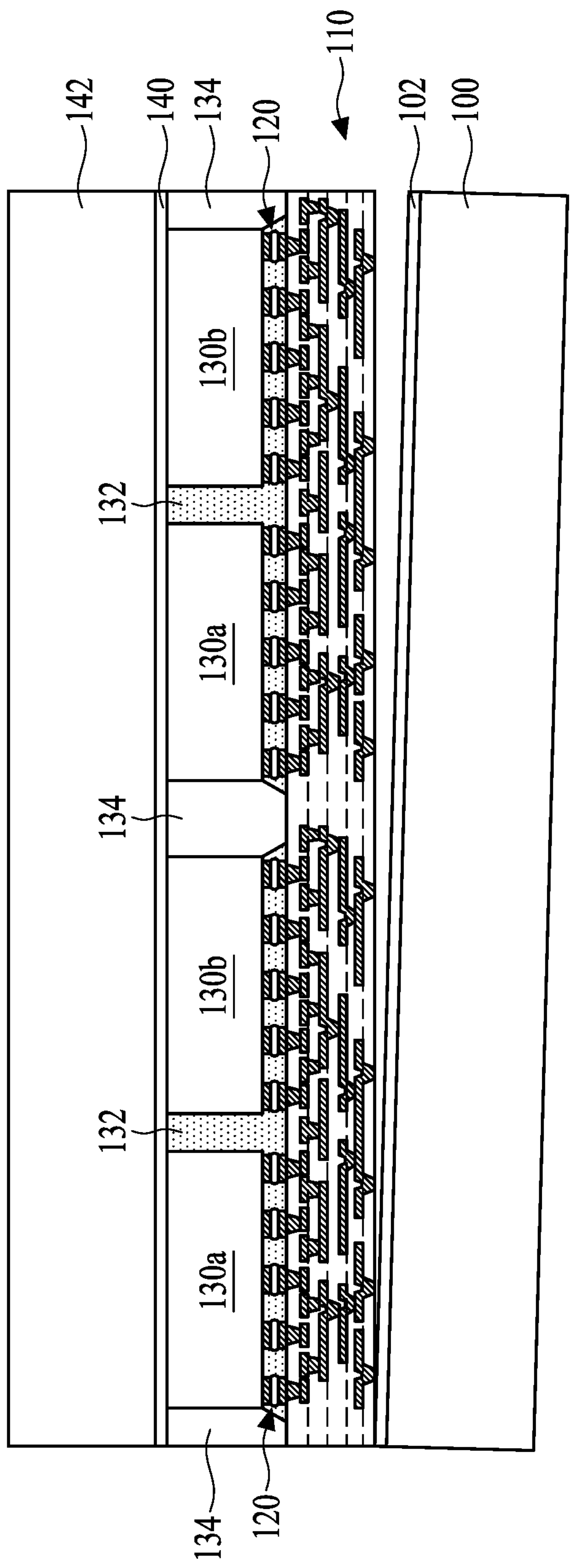

After the planarization process, the carrier substrate 100 is removed from the structure shown in FIG. 1D, as shown in FIG. 1E in accordance with some embodiments. More specifically, the upper surfaces of the second material layer 134, the first material layer 132, and the semiconductor dies 130*a* and 130*b* may be attached to a carrier substrate 142 via a de-bonding layer 140. More specifically, the carrier substrate 142 may be a glass carrier substrate, a ceramic carrier substrate or any suitable carrier substrate. The de-bonding layer 140 may include a LTHC layer or an adhesive layer (such as a ultra-violet curable adhesive or a heat curable adhesive layer). The de-bonding layer 140 is decomposable under the heat of light, so as to remove the carrier substrate 142 from the overlying structure in the subsequent steps.

Subsequently, the carrier substrate 100 is de-bonded so as to separate the interconnect structure 110 and the overlying structure from the carrier substrate 100. In the some embodiments, a de-bonding process includes projecting a light such as a laser light or an UV light on the de-bonding layer (e.g., the LTHC layer) 102 on the carrier substrate 100, so that the carrier substrate 100 can be easily removed. In some embodiments, the de-bonding layer 102 is further removed or peeled off.

Figure 1F:
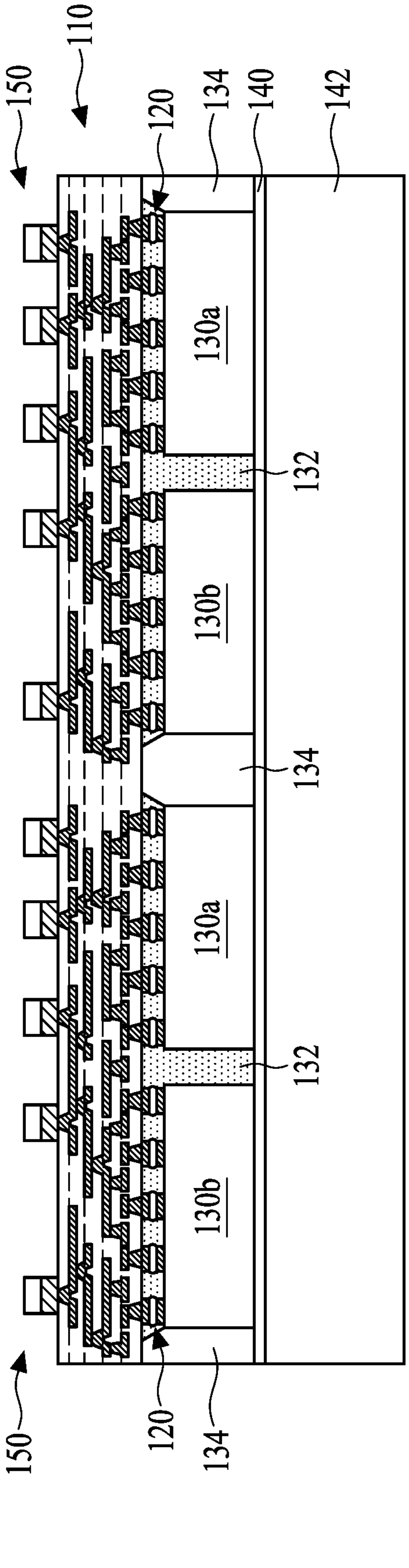

After the removal of the carrier substrate 100, bump structures 150 (e.g., controlled collapse chip connection (C4) bumps) are formed on the exposed surface of the interconnect structure 110 due to the removal of the carrier substrate 100, as shown in FIG. 1F in accordance with some embodiments. The bump structures 150 may be solder balls and formed on bond pads (not shown) of the interconnect structure 110 by using a ball-mounting head (not shown).

In some embodiments, the size of bump structures 150 is greater than that of bump structures 120. The bump structures 150 may be made of a material such as tin, silver, lead-free tin, or copper. The bump structures 150 serve as an electrical connection between the interconnect structure 110 and an external circuit (not shown). Optional under bump metallization (UBM) layers (not shown) may be correspondingly formed between the bond pads of the interconnect structure 110 and the bump structures 150.

Figure 1G:
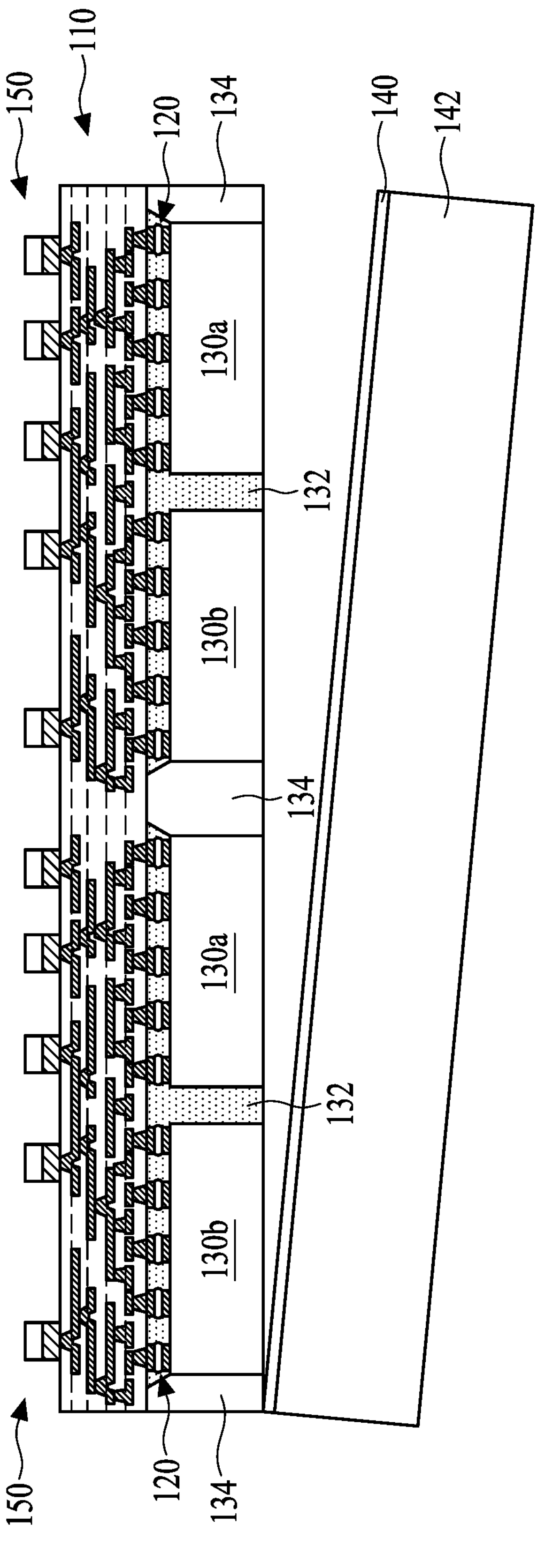

After the formation of the bump structures 150, the carrier substrate 142 is de-bonded so as to remove the carrier substrate 142 from the overlying structure, as shown in FIG. 1G. For example, the method for removing the carrier substrate 142 may be the same as or similar to the method for removing the carrier substrate 100.

Figure 1H:
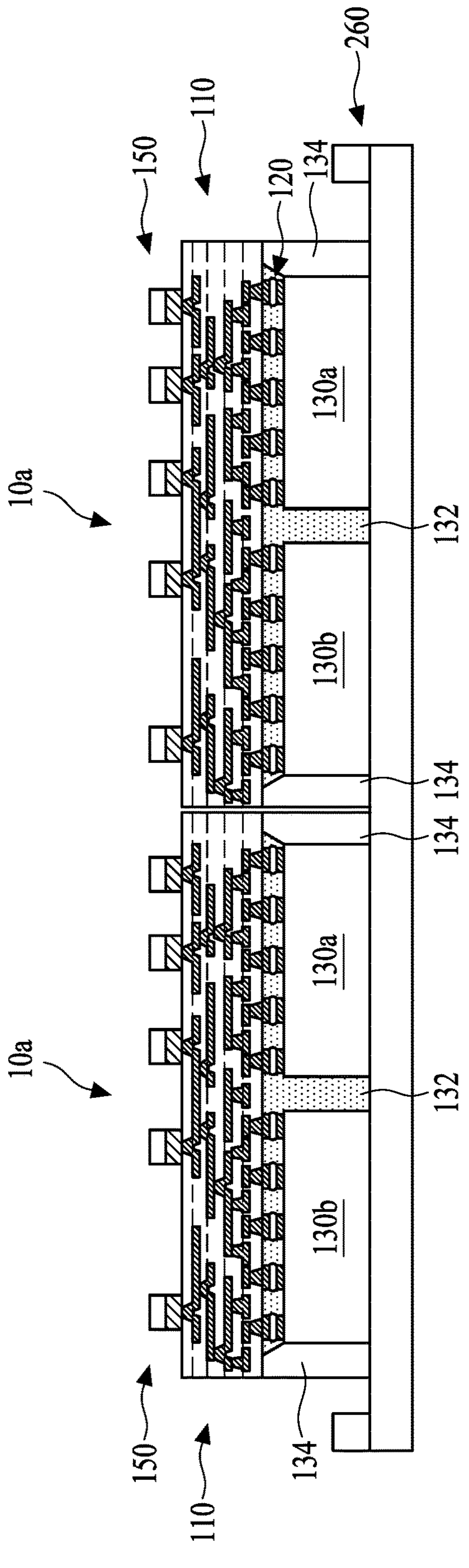

As shown in FIG. 1H, the structure after the removal of the carrier substrate 142 (as shown in FIG. 1G) is attached to a carrier 260, in accordance with some embodiments. The carrier 260 may include a tape layer supported by a frame. The exposed surface of the semiconductor dies 130*a* and 130*b* and exposed surface of the first and second material layers 132 and 134 are attached to the tape layer of the carrier 260, so that the bump structures 150 opposite to the carrier 260.

Afterwards, the structure including the semiconductor dies 130*a* and 130*b*, the first and second material layers 132 and 134, the interconnect structure 110 and the bump structures 120 and 150 is diced by a sawing process, an etching process, or a combination thereof, in accordance with some embodiments. For example, such a structure may be diced by a sawing process using one or more blades, and therefore the singulated semiconductor packages 10*a* are formed.

In some embodiments, as shown in FIG. 1H, each of the semiconductor packages 10*a* includes the semiconductor die 130*a* and the semiconductor die 130*b* over the diced interconnector structure 110 and surrounded by the first and second material layers 132 and 134. Each semiconductor package 10*a* also includes bump structures 120 and 150 formed on opposite surfaces of the diced interconnector structure 110.

It should be noted that although there are two semiconductor dies 130*a* and 130*b* formed in one semiconductor package 10*a*, the number of the semiconductor dies is based on design demands and is not limited to the embodiments shown in FIG. 1H. In some embodiments, one or more than two semiconductor dies can be arranged in the semiconductor package 10*a*.

Figure 1I:
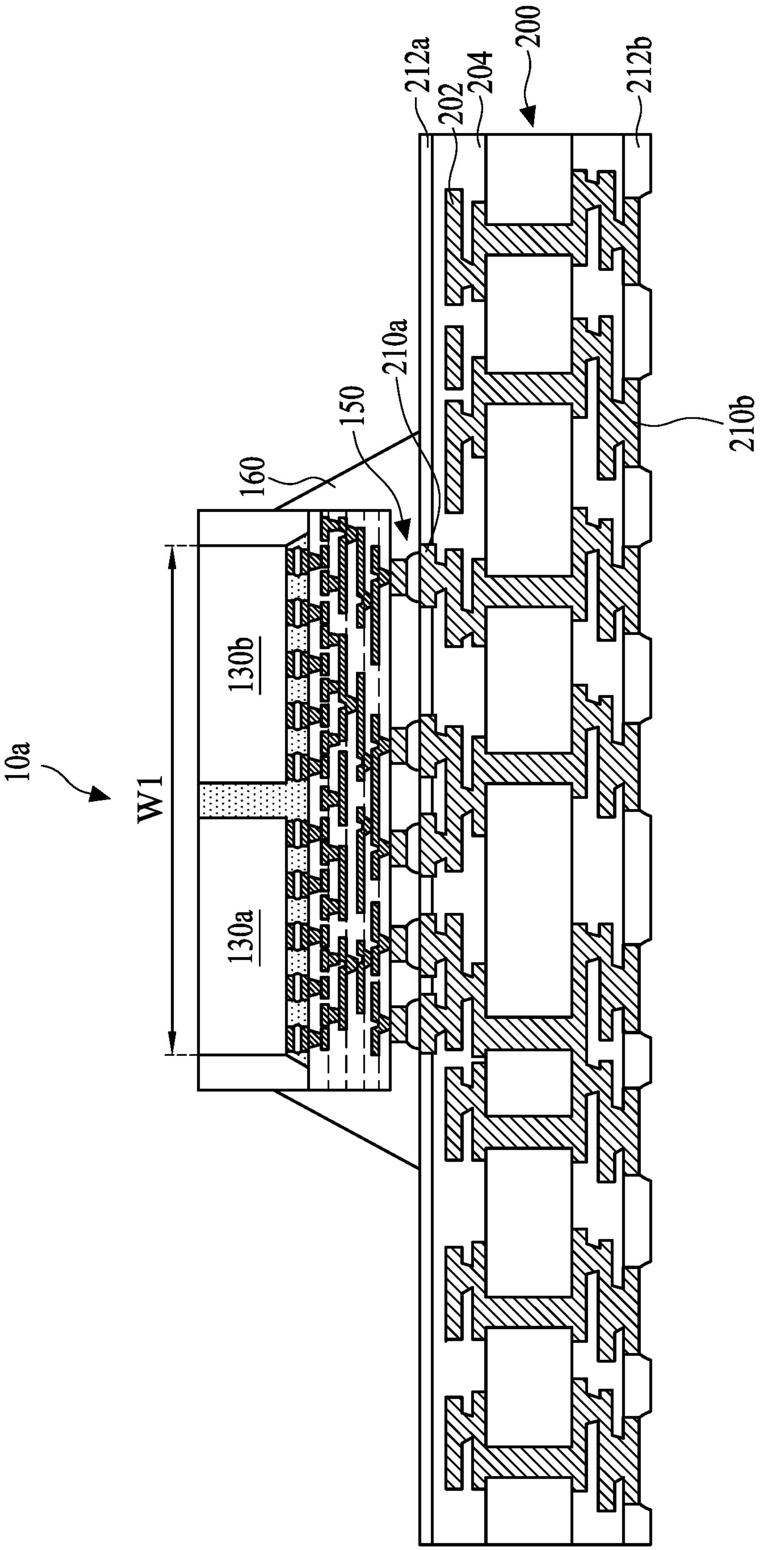

After the singulated semiconductor packages 10*a* are formed, each semiconductor package 10*a* is removed from the carrier 260 and formed over a package substrate 200, as shown in FIG. 1I in accordance with some embodiments. More specifically, the package substrate 200 includes a base layer 204, an RDL structure 202 formed in a base layer 204, first and second passivation layers 212*a* and 212*b* covering upper and lower surfaces of the base layer 204, respectively, and first and second bond pads 210*a* and 210*b* exposed from the first and second passivation layers 212*a* and 212*b*, respectively. The RDL structure 202 may be used as a fan-out RDL structure for routing.

In some embodiments, the semiconductor package 10*a* has a width W1 defined by the sum of the widths of the semiconductor dies 130*a* and 130*b* and the distance between the semiconductor dies 130*a* and 130*b*. It should be noted that the width W1 may be adjusted according to the arrangement and the number of the semiconductor dies and is not limited to the embodiments shown in FIG. 1I. For example, there are three semiconductor dies arranged side by side, the width W1 is defined by the sum of the widths of the semiconductor dies and the sum of the distances between the semiconductor dies.

The RDL structure 202 includes one or more conductive layers (such as copper) embedded within one or more dielectric layers (which form the base layer 204). The dielectric layers may include an organic material such as polybenzoxazole (PBO), polyimide (PI), one or more other suitable polymer materials, or a combination thereof.

It should be noted that while the materials discussed are suitable to form the conductive layers and the dielectric layers, those materials are merely exemplary. Any other suitable materials and any other suitable processes of formation may be used to form the conductive layers and the dielectric layers.

The first and second passivation layers 212*a* and 212*b* may be a single layer or a multi-layer structure. In some embodiments, the first and second passivation layers 212*a* and 212*b* is a single layer and has openings exposing first and second bond pads 210*a* and 210*b*, respectively. The first and second passivation layers 212*a* and 212*b* are made of dielectric material(s) and provide stress relief for bonding stress incurred during subsequent bonding processes. For example, the first and second passivation layers 212*a* and 212*b* may be made of a polymer material, such as polyimide, PBO, BCB, the like, or a combination thereof.

The semiconductor package 10*a* is bonded to the first bond pads 210*a* of the package substrate 200 using the bump structures 150. Afterwards, an underfill material layer 160 is formed around the semiconductor package 10*a* and between the semiconductor package 10*a* and the package substrate 200 to fill the gaps between them, as shown in FIG. 1I in accordance with some embodiments. The underfill material layer 160 is employed to protect and support the semiconductor package 10*a* from operational and environmental degradation, such as stresses caused by the generation of heat during operation. The underfill material layer 160 may be made of an epoxy-based resin or other protective material. In some embodiments, the formation of the underfill material layer 160 involves an injecting process, a dispensing process, a film lamination process, one or more other applicable processes, or a combination thereof. In some embodiments, a thermal curing process is then used to cure the underfill material layer 160.

Figure 1J:
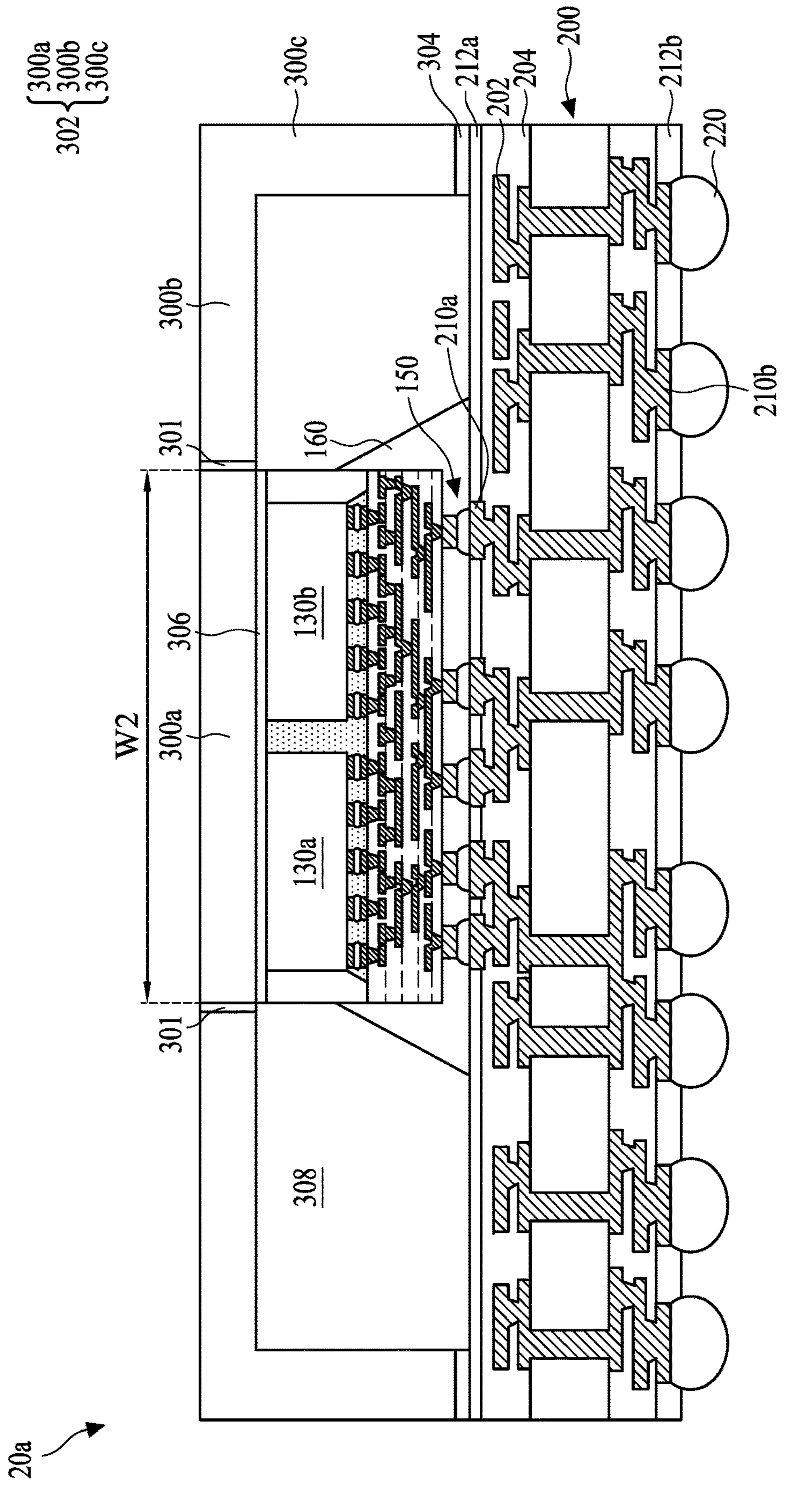

After the underfill material layer 160 is formed, a stiffener structure 302 and electrical connectors 220 are formed over the opposite surfaces of the package substrate 200, respectively, to form a chip package structure 20*a*, as shown in FIG. 1J in accordance with some embodiments. More specifically, the metal stiffener structure 302 is attached to the upper surface of the package substrate 200 through the adhesive layer 304 and to the upper surface of the semiconductor package 10*a* through the adhesive layer 306, so that there is a cavity 308 formed between the metal stiffener structure 302 and the package substrate 200, and the semiconductor package 10*a* is contained within the cavity 308. In some embodiments, the metal stiffener structure 302 includes a metal lid cap portion 300*a*, a metal ring portion 300*b* and a metal spacer wall portion 300*c*.

The metal lid cap portion 300*a* corresponds and connected to the upper surfaces of the semiconductor dies 130*a* and 130*b* and the encapsulating layer including the first and second material layers 132 and 134 through the adhesive layer 306. In some embodiments, the metal lid cap portion 300*a* serves a heat-dissipating feature (e.g., a heat spreader lid)) for heat dissipation. In order to enhance the heat dissipation of the subsequently formed chip package structure 20*a*, the metal lid cap portion 300*a* has a thermal conductivity higher than those of the metal ring portion 300*b* and the metal spacer wall portion 300*c*. For example, the metal lid cap portion 300*a* may be made of copper (Cu). Moreover, the adhesive layer 306 may be a composite thermal interface material (TIM) layer.

In some embodiments, the metal ring portion 300*b* is connected to the edge (or sidewall) surface of the metal lid cap portion 300*a* by a welding process. As a result, a welding region 301 is formed between the metal ring portion 300*b* and the metal lid cap portion 300*a*. Further, the metal ring portion 300*b* surrounds the metal lid cap portion 300*a* and the semiconductor package 10*a*. Moreover, the metal spacer wall portion 300*c* extends from the metal ring portion 300*b* to the upper surface of the package substrate 200 and is attached to the upper surface of the package substrate 200 through the adhesive layer 304, so that the metal spacer wall portion 300*c* also surrounds the semiconductor package 10*a*. For example, the metal ring portion 300*b* and the metal spacer wall portion 300*c* are formed of the same material layer, so that there is no interface between the metal ring portion 300*b* and the metal spacer wall portion 300*c*.

Although the warpage of the subsequently formed chip package structure 20*a* can be suppressed by the formation of the metal stiffener structure during reliability test in the manufacture of the subsequently formed chip package structure 20*a*, a stiffener structure of copper may induce damage (e.g., crack) of the encapsulating layer formed between the semiconductor dies 130*a* and 130*b* (i.e., the first material layer 132). Therefore, in some embodiments, the coefficient of thermal expansion (CTE) of the material used in the metal ring portion 300*b* and the metal spacer wall portion 300*c* is lower than the CTE of the material (e.g., copper) used in metal lid cap portion 300*a*. As a result, the stress induced in the first material layer 132 can be mitigated during reliability test, thereby increasing the reliability of the encapsulating layer in the subsequently formed chip package structure 20*a*. For example, the metal ring portion 300*b* and the metal spacer wall portion 300*c* may be made of alloy 42, SUS304, or SUS430.

In some embodiments, the metal lid cap portion 300*a* has a width W2. In order to maintain its heat dissipation performance while mitigating the stress in the encapsulating layer between the semiconductor dies 130*a* and 130*b*, the ratio of the width W2 to the width W1 (as indicated in FIG. 1I) (W2/W1) is controlled. If the ratio (W2/W1) is too high, the damage (e.g., the crack risk) to the encapsulating layer of the chip package structure 20*a* cannot be effectively suppressed. If the ratio (W2/W1) is too low, the heat dissipation performance is reduced. Therefore, in some embodiment, the ratio (W2/W1) is controlled in a range higher than 0.8 and lower than 1.2 ($0.8<W2/W1<1.2$).

After the metal stiffener structure 302 is formed over the upper surface of the package substrate 200, electrical connectors 220 are formed in the second passivation layer 212*b* of the package substrate 200 to form the chip package structure 20*a*, as shown in FIG. 1J in accordance with some embodiments. More specifically, the electrical connectors 220 are solder balls formed in the openings of the second passivation layer 212*b* that exposes the second bond pads 210*b* by using a ball-mounting head (not shown). The electrical connectors 220 may be larger than the bump structures 150. The electrical connectors 220 may be made of a material such as tin, silver, lead-free tin, or copper. The electrical connectors 220 serve as an electrical connection between the package substrate 200 and an external circuit (not shown). Optional under bump metallization (UBM) layers (not shown) may be correspondingly formed between the second bond pads 210*b* and the electrical connectors 220.

Many variations and/or modifications can be made to embodiments of the disclosure. For example, in the chip package structure 20*a* shown in FIG. 1J, the metal ring portion 300*b* and the metal spacer wall portion 300*c* of the metal stiffener structure 302 are formed by a one-piece metal material layer. However, embodiments of the disclosure are not limited thereto. FIGS. 2 to 5 show cross-sectional views of various chip package structures, in accordance with some embodiments. The chip package structures 20*b*, 20*c*, 20*d* and 20*e* shown in FIGS. 2 to 5 are similar to the chip package structure 20*a* shown in FIG. 1J. In some embodiments, the materials, formation methods, and/or benefits of the chip package structure 20*a* shown in FIGS. 1A to 1J can also be applied in the embodiments illustrated in FIGS. 2 to 5, and are therefore not repeated.

Figure 2:
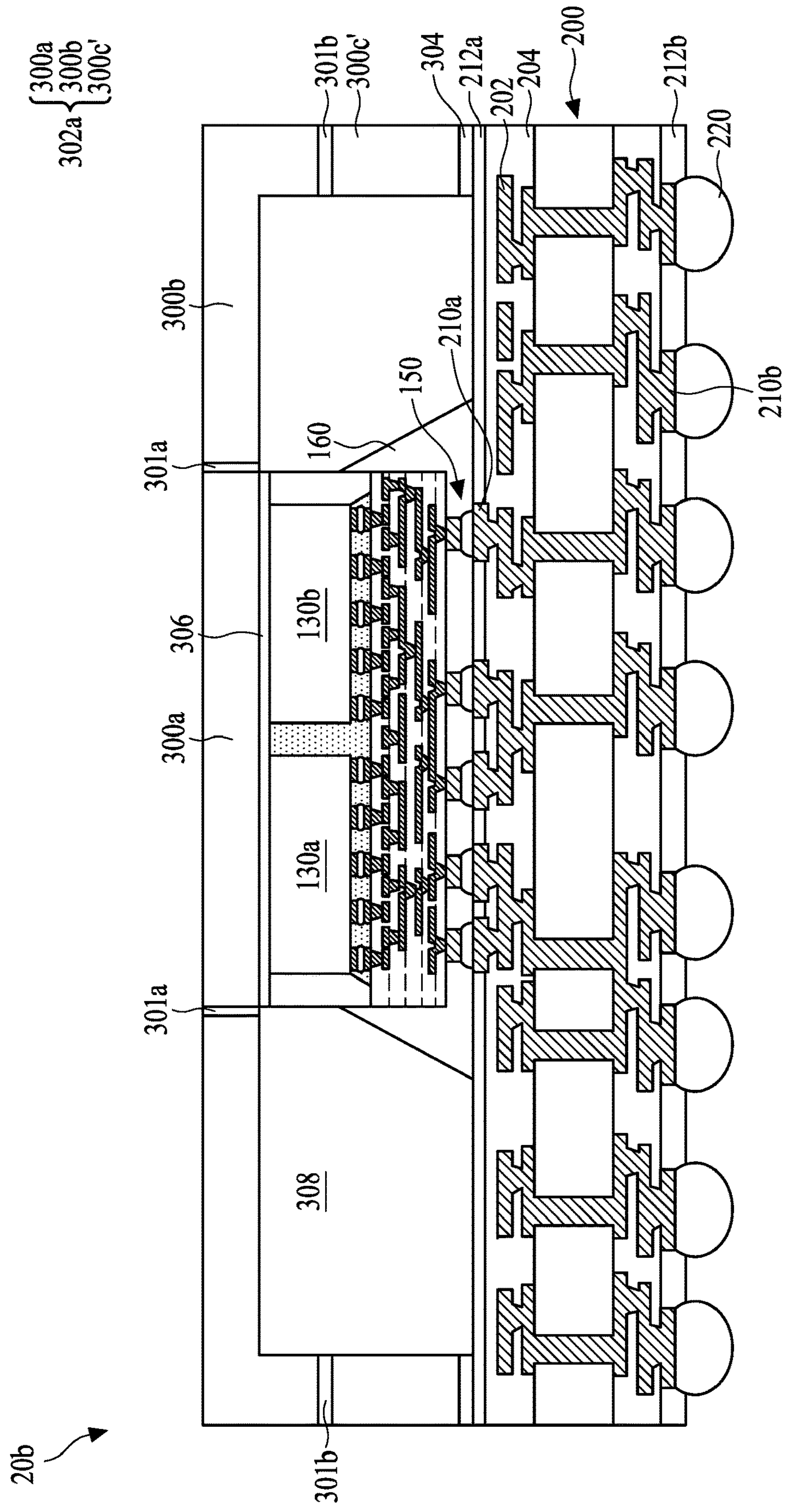
FIG. 2 is a cross-sectional view of a chip package structure, in accordance with some embodiments.

As shown in FIG. 2, unlike the chip package structure 20*a* shown in FIG. 1J, the metal ring portion 300*b* and the metal spacer wall portion 300*c*' of the metal stiffener structure 302*a* are formed by a multi-piece metal material structure. More specifically, the metal ring portion 300*b* is connected between the edge (or sidewall) surface of the metal lid cap portion 300*a* and the upper surface of the metal spacer wall portion 300*c*' by a welding process. As a result, a welding region 301*a* is formed between the metal ring portion 300*b* and the metal lid cap portion 300*a* and a welding region 301*b* is formed between the metal ring portion 300*b* and the metal spacer wall portion 300*c*'. Further, a portion of the metal ring portion 300*b* vertically extends to the upper surface of the metal spacer wall portion 300*c*' to surround the semiconductor package 10*a*. Moreover, the metal spacer wall portion 300*c*' extends from the vertically extending portion of the metal ring portion 300*b* to the upper surface of the package substrate 200 and is attached to the upper surface of the package substrate 200 through the adhesive layer 304, so that the metal spacer wall portion 300*c*' also surrounds the semiconductor package 10*a*. As a result, the upper surface of the metal spacer wall portion 300*c*' is lower than the lower surface of the metal lid cap portion 300*a* and/or the upper surface of the semiconductor package 10*a*.

In those cases, the metal ring portion 300*b* and the metal spacer wall portion 300*c*' are made of different material layers. In some embodiments, the metal ring portion 300*b* and the metal spacer wall portion 300*c*' are made of alloy 42, SUS304, or SUS430. Moreover, the CTE of the metal ring portion 300*b* is lower than the CTE of the metal lid cap portion 300*a* and higher than the CTE of the metal spacer wall portion 300*c*'. As a result, the stress induced in the first material layer 132 between the semiconductor dies 130*a* and 130*b* can be further mitigated during reliability test, thereby increasing the reliability of the chip package structure 20*b*.

Figure 3:
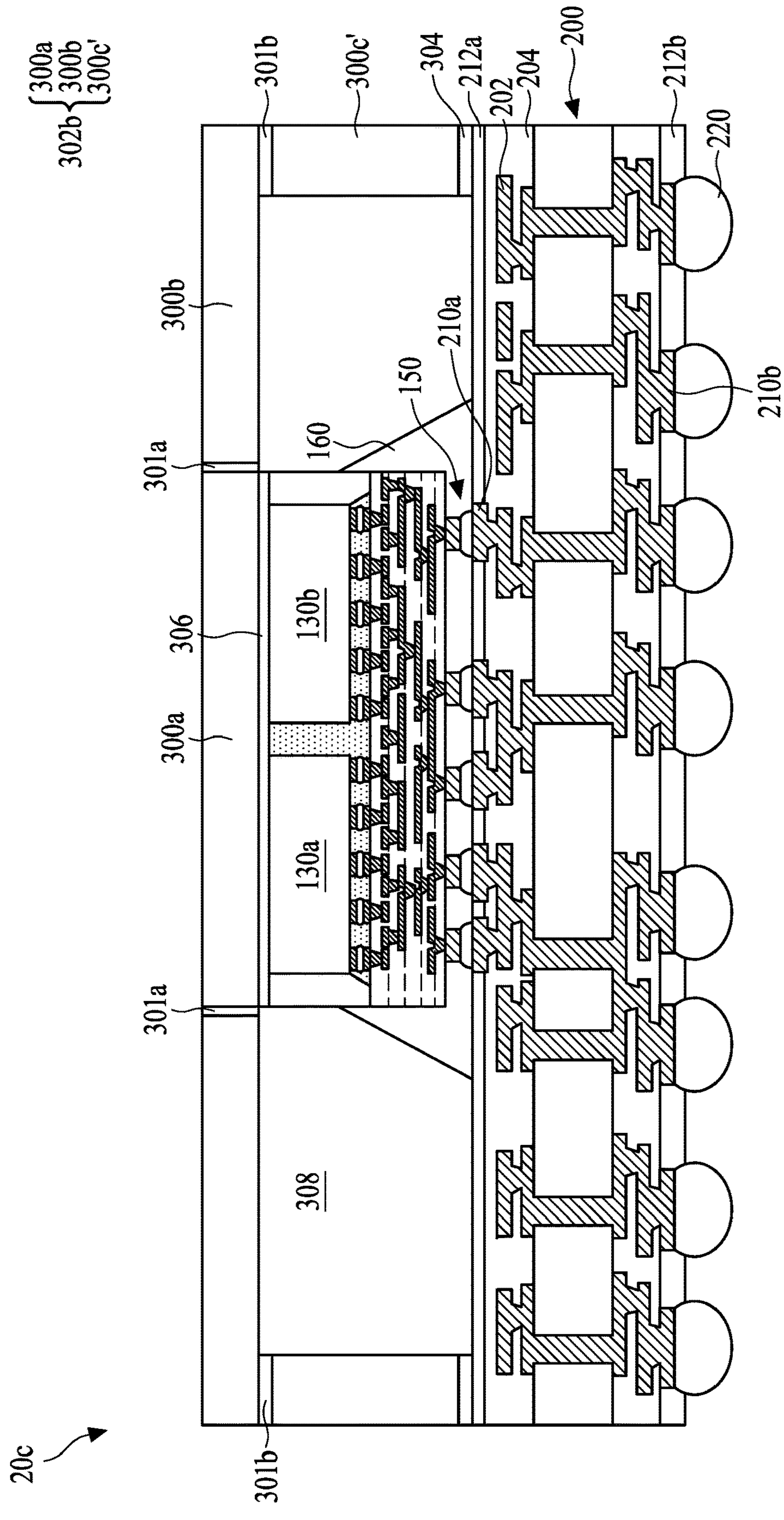
FIG. 3 is a cross-sectional view of a chip package structure, in accordance with some embodiments.

As shown in FIG. 3, similar to the metal stiffener structure 302*a* of the chip package structure 20*b* shown in FIG. 2, the metal ring portion 300*b* and the metal spacer wall portion 300*c*' of the metal stiffener structure 302*b* in the chip package structure 20*c* are formed by a multi-piece metal material structure. However, unlike the metal stiffener structure 302*a*, the metal ring portion 300*b* is connected between the edge (or sidewall) surface of the metal lid cap portion 300*a* and the upper surface of the metal spacer wall portion 300*c*' by a welding process. As a result, the welding region 301*b* is formed between the lower surface of the metal ring portion 300*b* and the upper surface of the metal spacer wall portion 300*c*'. Moreover, the upper surface of the metal spacer wall portion 300*c*', the lower surface of the metal lid cap portion 300*a*, and/or the lower surface of the metal ring portion 300*b* are substantially at the same level. In addition, the outer edge surface of the metal ring portion 300*b* is substantially aligned to an outer sidewall surface of the metal spacer wall portion 300*c*'.

Figure 4:
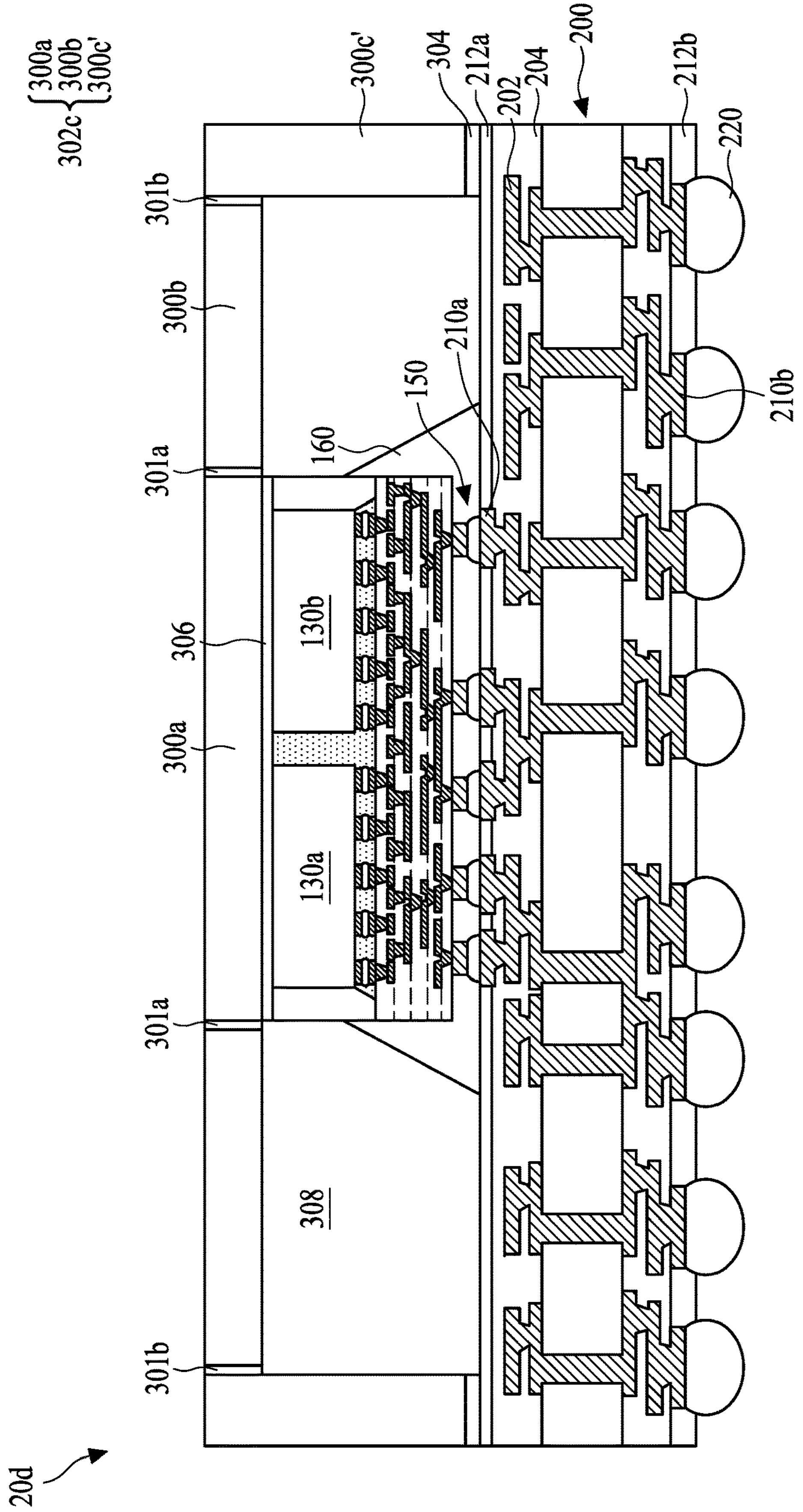
FIG. 4 is a cross-sectional view of a chip package structure, in accordance with some embodiments.

As shown in FIG. 4, similar to the metal stiffener structure 302*a* of the chip package structure 20*b* shown in FIG. 2 and the metal stiffener structure 302*b* of the chip package structure 20C shown in FIG. 3, the metal ring portion 300*b* and the metal spacer wall portion 300*c*' of the metal stiffener structure 302*c* in the chip package structure 20*d* are formed by a multi-piece metal material structure. However, unlike the metal stiffener structures 302*a* and 302*b*, the metal ring portion 300*b* is connected between the edge (or sidewall) surface of the metal lid cap portion 300*a* and the inner edge (or sidewall) surface of the metal spacer wall portion 300*c*' by a welding process. As a result, the welding region 301*b* is formed between the outer edge (or sidewall) surface of the metal ring portion 300*b* and the inner edge (or sidewall) surface of the metal spacer wall portion 300*c*'. Moreover, the upper surface of the metal spacer wall portion 300*c*' and the upper surface of the metal lid cap portion 300*a* and/or the upper surface of the metal ring portion 300*b* are substantially at the same level.

Figure 5:
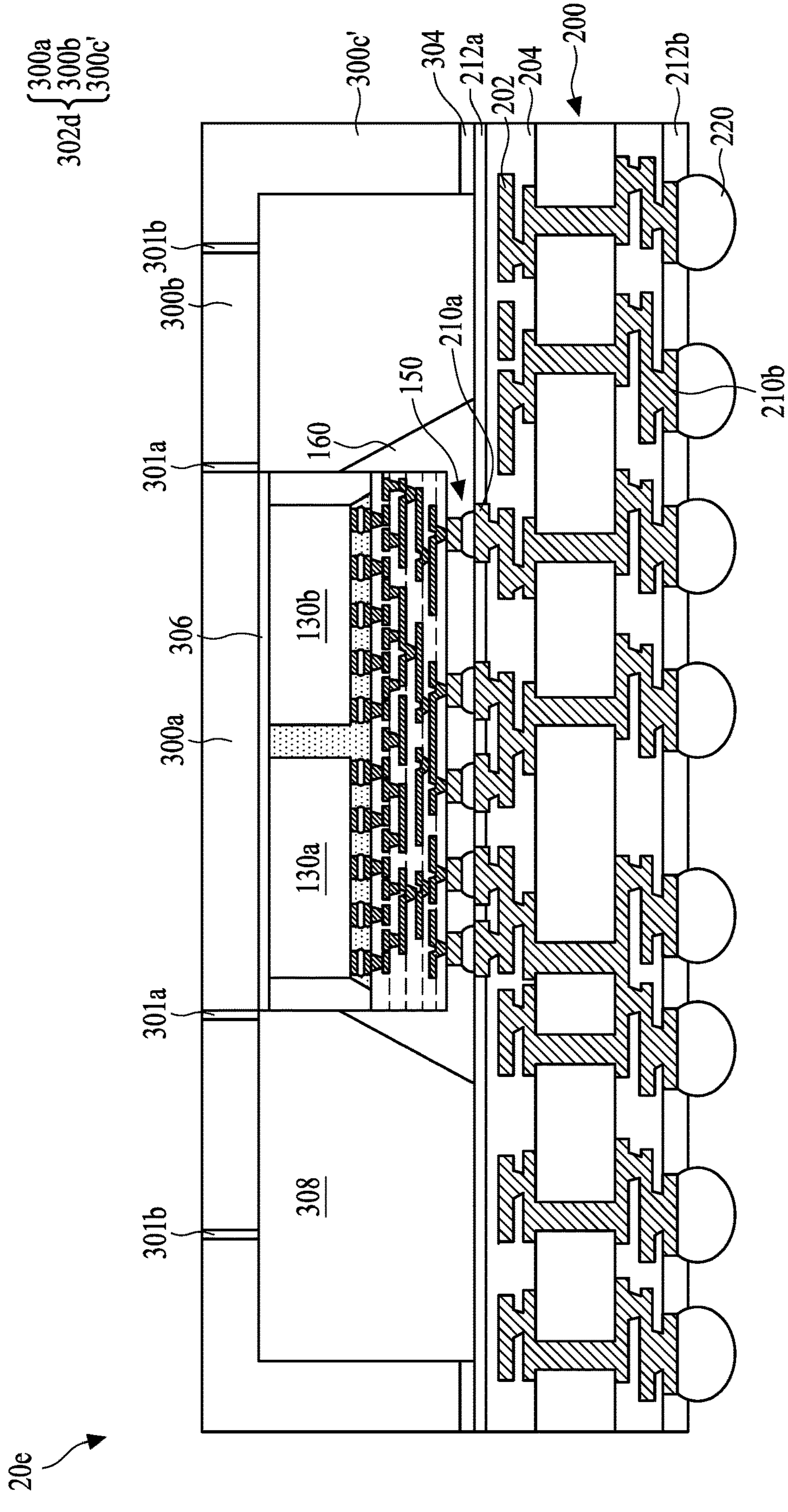
FIG. 5 is a cross-sectional view of a chip package structure, in accordance with some embodiments.

As shown in FIG. 5, similar to the metal stiffener structure 302*c* of the chip package structure 20*d* shown in FIG. 4, the metal ring portion 300*b* and the metal spacer wall portion 300*c*' of the metal stiffener structure 302*d* in the chip package structure 20*e* are formed by a multi-piece metal material structure. However, unlike the metal stiffener structure 302*c*, a portion of the metal spacer wall portion 300*c*' laterally extends to the outer edge (or sidewall) surface of the metal ring portion 300*b* to surround the metal lid cap portion 300*a* and the metal ring portion 300*b*. As a result, the welding region 301*b* is formed between the outer edge (or sidewall) surface of the metal ring portion 300*b* and the sidewall surface of the laterally extended portion of the metal spacer wall portion 300*c*'. Moreover, the upper surface of the laterally extended portion of the metal spacer wall portion 300*c*' and the upper surface of the metal lid cap portion 300*a* and/or the upper surface of the metal ring portion 300*b* are substantially at the same level.

Figure 6A:
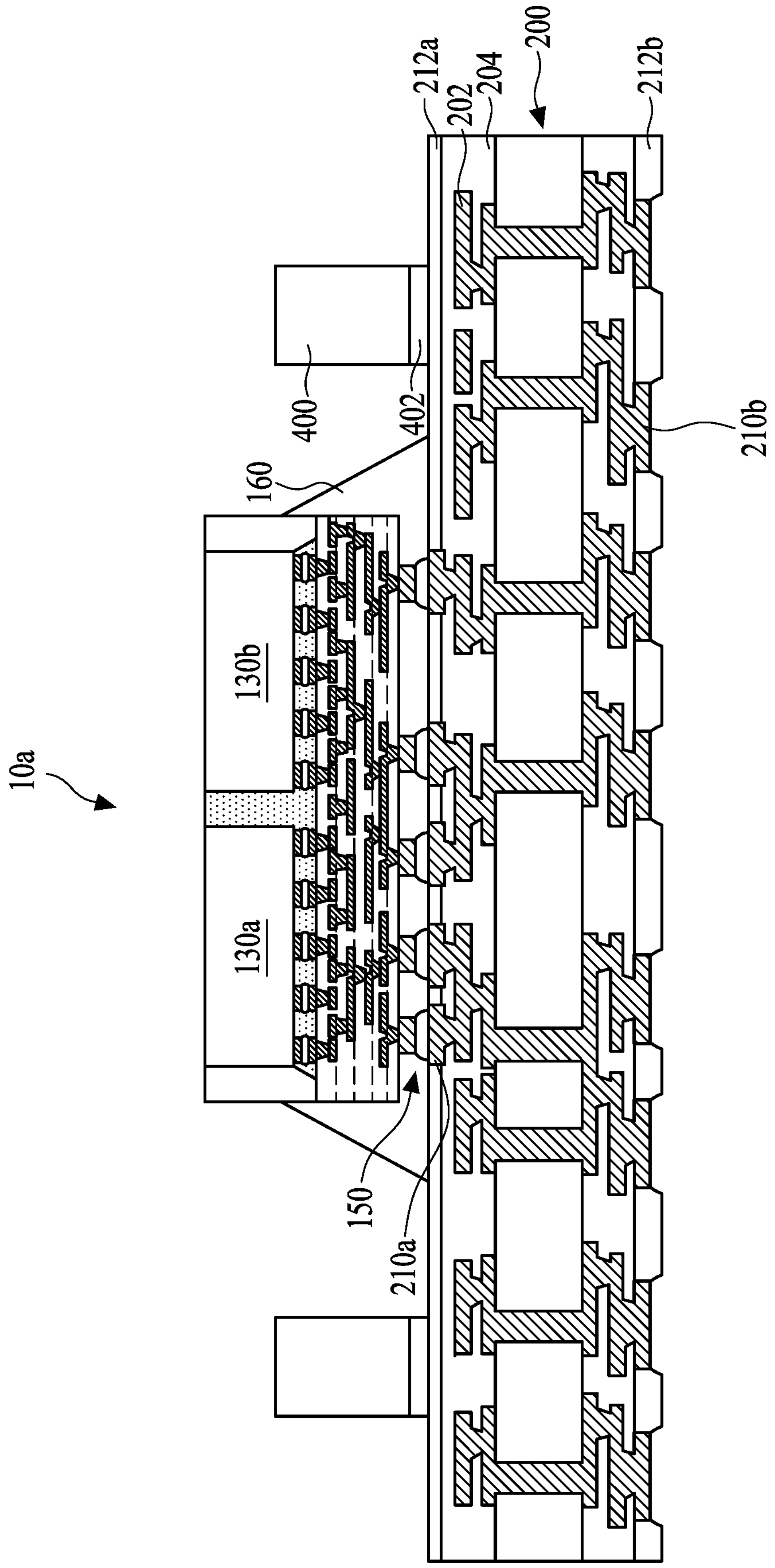
FIGS. 6A to 6B are cross-sectional views of various stages of a method for forming a chip package structure, in accordance with some embodiments.
Figure 6B:
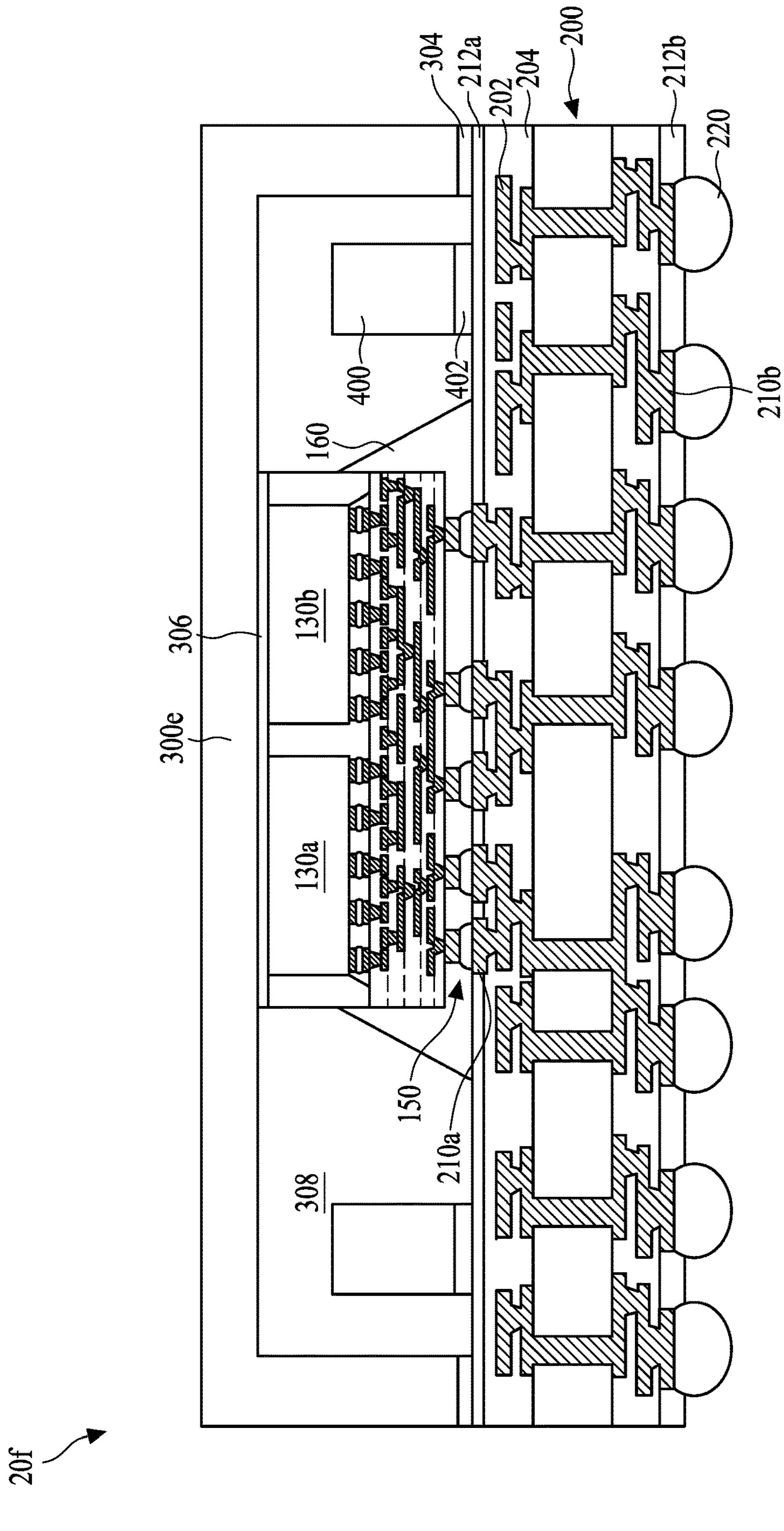

FIGS. 6A to 6B are cross-sectional views of various stages of a process for forming a chip package structure 20*f*, in accordance with some embodiments. Additional operations can be provided before, during, and/or after the stages described in FIGS. 6A to 6B. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 6A, a structure as shown in FIG. 1I is provided and a metal stiffener structure 400 is formed over the package substrate 200 and surrounding the semiconductor package 10*a*, in accordance with some embodiments. More specifically, the metal stiffener structure 400 is a metal ring that is attached to the upper surface of the package substrate 200 through an adhesive layer 402.

Afterwards, a stiffener structure 300*e* and electrical connectors 220 are formed over the opposite surfaces of the package substrate 200, respectively, to form a chip package structure 20*f*, as shown in FIG. 6B in accordance with some embodiments. More specifically, the metal stiffener structure 300*e* is attached to the upper surface of the package substrate 200 through the adhesive layer 304. The metal stiffener structure 300*e* is also attached to the upper surface of the semiconductor package 10*a* through the adhesive layer 306, so that there is a cavity 308 formed between the metal stiffener structure 300*e* and the package substrate 200, and the semiconductor package 10*a* is contained within the cavity 308. In some embodiments, the metal stiffener structure 300*e* surrounds and is spaced apart from the metal stiffener structure 400. The metal stiffener structure 300*e* has a shape and/or a dimension that is the same as or similar to those of the metal stiffener structure 302 shown in FIG. 1J.

However, unlike the metal stiffener structure 302 shown in FIG. 1J, the metal stiffener structure 300*e* is formed by a one-piece metal material layer. In addition, the metal stiffener structure 300*e* is made of a material that has a higher thermal conductivity and a lower CTE than the material of the metal stiffener structure 400. For example, the metal stiffener structure 300*e* is made of copper, and the metal stiffener structure 400 is made of alloy 42, alloy 42, SUS304, or SUS430. As a result, the heat dissipation performance of the chip package structure 20*f* can be improved by the metal stiffener structure 300*e* of copper. Moreover, the stress induced in the first material layer 132 can be mitigated during reliability test, thereby increasing the reliability of the chip package structure 20*f*.

After the metal stiffener structure 300*e* is formed over the upper surface of the package substrate 200, electrical connectors 220 are formed in the second passivation layer 212*b* of the package substrate 200 in accordance with some embodiments. Optional under bump metallization (UBM) layers (not shown) may be correspondingly formed between the second bond pads 210*b* and the electrical connectors 220.

Figure 7:
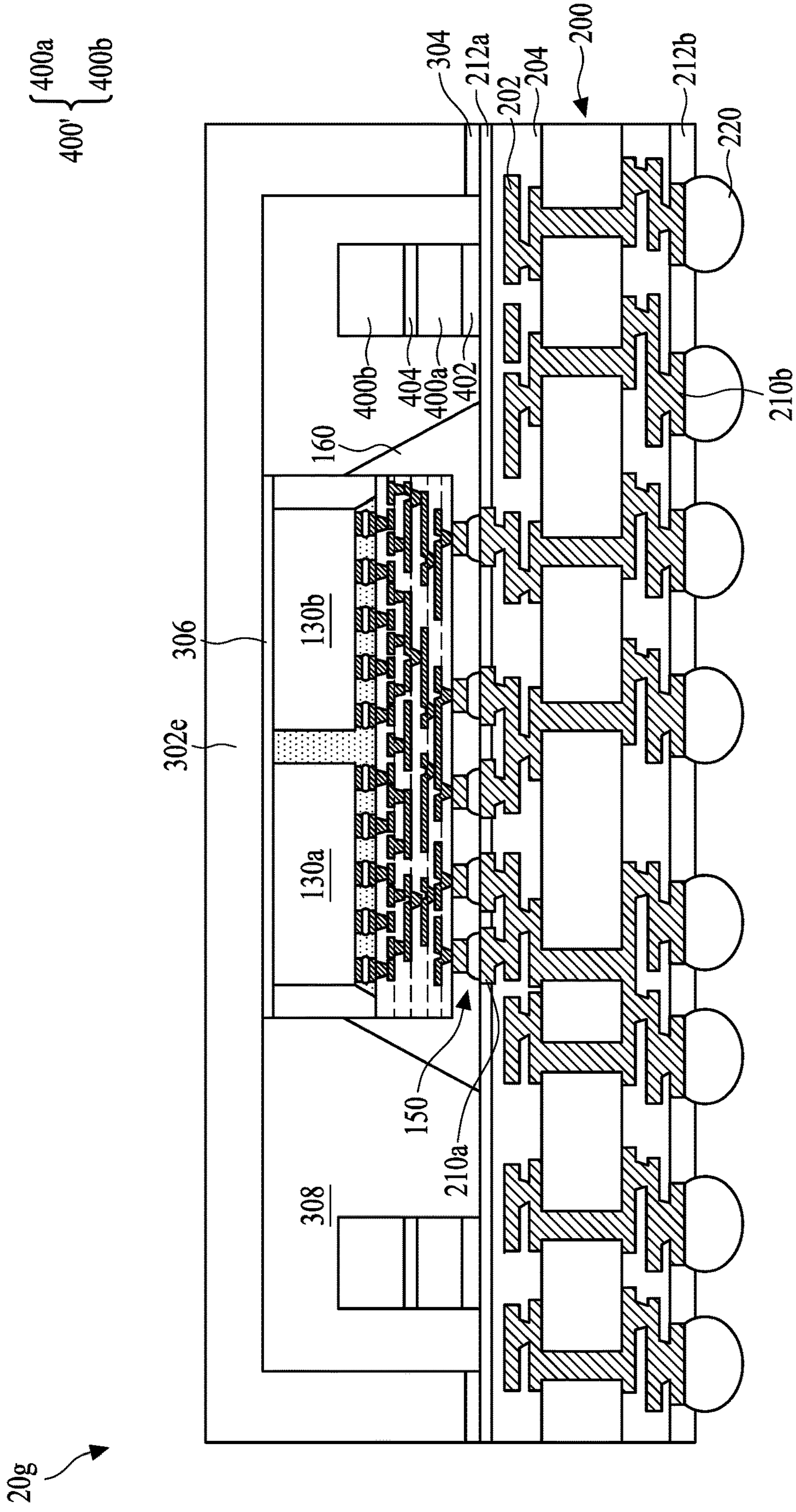
FIG. 7 is a cross-sectional view of a chip package structure, in accordance with some embodiments.

Many variations and/or modifications can be made to embodiments of the disclosure. For example, in the chip package structure 20*f* shown in FIG. 6B, the metal stiffener structure 400 is formed by a one-piece metal material layer. However, embodiments of the disclosure are not limited thereto. FIG. 7 shows a cross-sectional view of a chip package structure 20*g*, in accordance with some embodiments. The chip package structure 20*g* shown in FIG. 7 is similar to the chip package structure 20*f* shown in FIG. 6B. In some embodiments, the materials, formation methods, and/or benefits of the chip package structure 20*f* shown in FIGS. 6A to 6B can also be applied in the embodiments illustrated in FIG. 7, and are therefore not repeated.

As shown in FIG. 7, unlike the chip package structure 20*f* shown in FIG. 6B, the metal stiffener structure 400' are formed by a multi-piece metal material structure. More specifically, the metal stiffener structure 400' includes a lower portion 400*a* attached to the upper surface of the package substrate 200 through an adhesive layer 402, and an upper portion 400*b* attached to the upper surface of the lower portion 400*a* through an adhesive layer 404. In some other embodiments, the upper portion 400*b* is connected to the upper surface of the lower portion 400*a* by a welding process without using the adhesive layer 404. The lower portion 400*a* and the upper portion 400*b* are made of different metal materials. Moreover, the metal stiffener structure 300*e* is also made of a metal material that is different from those of the lower portion 400*a* and the upper portion 400*b*. More specifically, the material of the metal stiffener structure 300*e* has higher thermal conductivity and CTE than those of the lower portion 400*a* and the upper portion 400*b*. Moreover, the CTE of the material of the upper portion 400*b* is higher than that of the material of the lower portion 400*a*. For example, the metal stiffener structure 300*e* is made of copper, and the lower portion 400*a* and the upper portion 400*b* are made of alloy 42, SUS304, or SUS430. As a result, the heat dissipation performance of the chip package structure 20*g* can be improved and the reliability of the chip package structure 20*f* can be increased.

Figure 8:
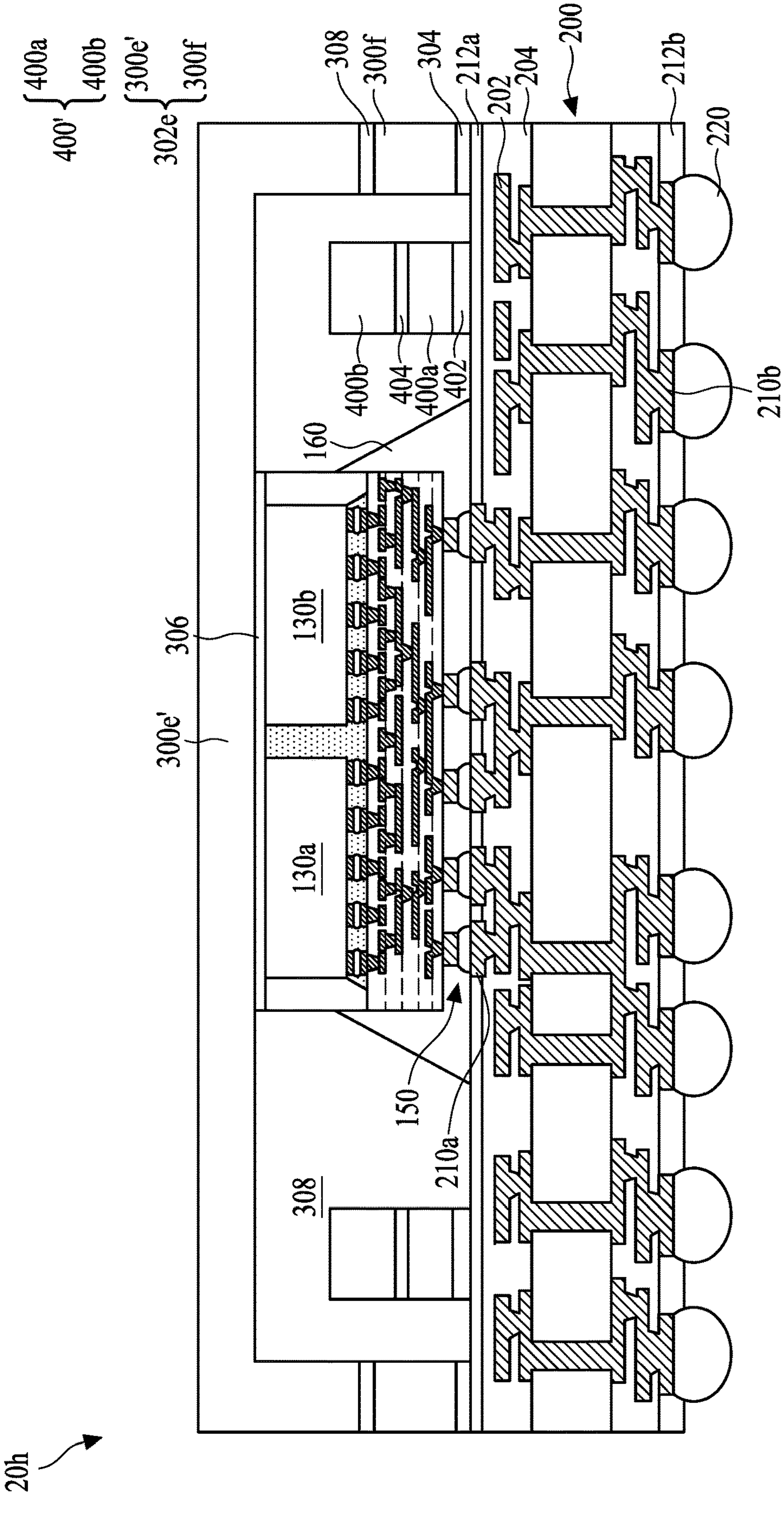
FIG. 8 is a cross-sectional view of a chip package structure, in accordance with some embodiments.

Many variations and/or modifications can be made to embodiments of the disclosure. For example, in the chip package structure 20*f* shown in FIG. 6B and the chip package structure 20*g* shown in FIG. 7, the metal stiffener structure 302*e* is formed by a one-piece metal material layer. However, embodiments of the disclosure are not limited thereto. FIG. 8 shows a cross-sectional view of a chip package structure 20*h*, in accordance with some embodiments. The chip package structure 20*h* shown in FIG. 8 is similar to the chip package structures 20*f* and 20*g* shown in FIGS. 6B and 7, respectively. In some embodiments, the materials, formation methods, and/or benefits of the chip package structure 20*f* shown in FIGS. 6A to 6B can also be applied in the embodiments illustrated in FIG. 8, and are therefore not repeated.

As shown in FIG. 8, unlike the chip package structure 20*g* shown in FIG. 7, the metal stiffener structure 302*e* are formed by a multi-piece metal material structure. More specifically, the metal stiffener structure 302*e* includes a spacer wall portion 300*f* over the package substrate 200 and surrounding the semiconductor package 10*a*, and a lid cap portion 300*e*' attached to the spacer wall portion 300*f* and the semiconductor package 10*a*. A portion of the lid cap portion 300*e*' vertically extends to the upper surface of the spacer wall portion 300*f* to surround the semiconductor package 10*a*. The vertically extended portion of the lid cap portion 300*e*' is attached to the upper surface of the spacer wall portion 300*f* by an adhesive layer 308. Further, the spacer wall portion 300*f* is attached to the upper surface of the package substrate 200 through the adhesive layer 304. As a result, the upper surface of the spacer wall portion 300*f* is lower than the lower surface of the lid cap portion 300*e*' and/or the upper surface of the semiconductor package 10*a*. In some other embodiments, the lid cap portion 300*e*' is connected to the upper surface of the spacer wall portion 300*f* by a welding process without using the adhesive layer 308.

In some embodiments, the lid cap portion 300*e*' and the spacer wall portion 300*f* are made of different metal material layers. The lid cap portion 300*e*' has a thermal conductivity that is higher than that of the spacer wall portion 300*f* and the thermal conductivities of the lower and upper portions 400*a* and 400*b* of the metal stiffener structure 400'. Moreover, the CTE of the lid cap portion 300*e*' is higher than that of the spacer wall portion 300*f*. For example, the lid cap portion 300*e*' may be made of copper and the spacer wall portion 300*f* may be made of alloy 42, SUS304, or SUS430. As a result, the heat dissipation performance of the chip package structure 20*g* can be improved and the reliability of the chip package structure 20*f* can be increased.

Embodiments of the disclosure provide structures and formation methods of chip package structures. In some embodiments, the chip package structure includes a semiconductor package capped by a stiffener structure that is formed by multi-piece metal material layers with different CTEs and thermal conductivities. The stiffener structure includes a metal lid cap portion covering the upper surface of the chip package structure, a metal ring portion connected to the metal lid cap portion by a welding process, and a metal spacer wall portion extending from the metal ring portion and surrounding the semiconductor package. The mechanical strength of the stiffener structure formed by multi-piece layers can be improved due to the welding process. Moreover, the thermal conductivity of the metal lid cap portion is higher than those of the metal ring portion and the metal spacer wall portion. The CTEs of the metal ring portion and the metal spacer wall portion are lower than that of the metal lid cap portion. As a result, the heat dissipation performance can be increased while mitigating the damage (e.g., the crack risk) in the encapsulating layer of the semiconductor package, thereby increasing the reliability of the chip package structure. In addition, in some other embodiments, an additional stiffener structure that is formed by one-piece metal material layer or multi-piece metal material layers is formed to surround the semiconductor package. As a result, the crack risk in the encapsulating layer can be reduced further, and an underlying substrate (e.g., a package substrate) expansion during the manufacture the chip package structure can also be suppressed.

In accordance with some embodiments, a chip package structure is provided. The chip package structure includes a semiconductor die formed over a package substrate and an interconnect structure bonded and electrically connected between the semiconductor die and the package substrate. The chip package structure also includes a stiffener structure formed over the package substrate and covering the semiconductor die. The metal stiffener structure includes a metal lid cap portion covering the upper surface of the semiconductor die, a metal ring portion surrounding the metal lid cap portion, and a metal spacer wall portion extending between the metal ring portion and the package substrate and surrounding the semiconductor die. The CTE of the metal spacer wall portion is lower than the CTE of the metal lid cap portion.

In accordance with some embodiments, a chip package structure is provided. The chip package structure includes a first semiconductor die formed over a package substrate and an interconnect structure bonded and electrically connected between the first semiconductor die and the package substrate. The chip package structure also includes a first metal stiffener structure formed over the package substrate and covering the upper surface of the first semiconductor die to form a cavity. The first semiconductor die and the interconnect structure are contained within the cavity. The chip package structure further includes a second metal stiffener structure formed over the package substrate, surrounding the first semiconductor die and within the cavity. The thermal conductivity and CTE of the first metal stiffener structure are higher than the thermal conductivity and CTE of the second metal stiffener structure.

In accordance with some embodiments, a chip package structure is provided. The chip package structure includes semiconductor dies formed over a package substrate and an interconnect structure bonded and electrically connected between the semiconductor dies and the package substrate. The chip package structure also includes a first metal stiffener structure formed over the package substrate and covering the semiconductor dies. The first metal stiffener structure includes a spacer wall portion over the package substrate and surrounding the semiconductor dies and a lid cap portion connected to the spacer wall portion. The chip package structure further includes a second metal stiffener structure formed over the package substrate, surrounding the semiconductor dies, and surrounded by the spacer wall portion. The second metal stiffener structure includes a lower portion attached to the package substrate and an upper portion attached to an upper surface of the lower portion. The CTE of each portion—the lower portion and the upper portion—is lower than the CTE of the lid cap portion.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
a semiconductor die formed over a package substrate;
an interconnect structure bonded and electrically connected between the semiconductor die and the package substrate; and
a stiffener structure formed over the package substrate and covering the semiconductor die, wherein the stiffener structure comprises:
a metal lid cap portion covering an upper surface of the semiconductor die;
a metal ring portion surrounding and welded to the metal lid cap portion; and
a metal spacer wall portion extending between the metal ring portion and the package substrate and surrounding the semiconductor die, wherein a coefficient of thermal expansion (CTE) of the metal spacer wall portion is lower than a CTE of the metal lid cap portion.

2. The chip package structure as claimed in claim 1, wherein a CTE of the metal ring portion is lower than the CTE of the metal lid cap portion and higher than the CTE of the metal spacer wall portion.

3. The chip package structure as claimed in claim 1, wherein a thermal conductivity of the metal lid cap portion is higher than a thermal conductivity of the metal ring portion and a thermal conductivity of the metal spacer wall portion.

4. The chip package structure as claimed in claim 1, wherein the metal spacer wall portion is welded to the metal ring portion.

5. The chip package structure as claimed in claim 1, wherein the metal ring portion is welded to an upper surface of the metal spacer wall portion, and wherein an outer edge surface of the metal ring portion is substantially aligned to a sidewall surface of the metal spacer wall portion.

6. The chip package structure as claimed in claim 1, wherein an outer edge surface of the metal ring portion is welded to a sidewall surface of the metal spacer wall portion, and wherein an upper surface of the metal ring portion is substantially level with an upper surface of the metal spacer wall portion.

7. The chip package structure as claimed in claim 1, wherein the metal lid cap portion is made of copper.

8. A chip package structure, comprising:
a first semiconductor die formed over a package substrate;

an interconnect structure bonded and electrically connected between the first semiconductor die and the package substrate;

a first metal stiffener structure formed over the package substrate and covering an upper surface of the first semiconductor die to form a cavity, wherein the first semiconductor die and the interconnect structure are contained within the cavity; and a second metal stiffener structure formed over the package substrate, surrounding the first semiconductor die and within the cavity, wherein a thermal conductivity and a coefficient of thermal expansion (CTE) of the first metal stiffener structure are higher than a thermal conductivity and a CTE of the second metal stiffener structure.

9. The chip package structure as claimed in claim 8, further comprising:

a second semiconductor die bonded over and electrically connected to the interconnect structure, wherein the second semiconductor die and the first semiconductor die are homogeneous semiconductor dies.

10. The chip package structure as claimed in claim 8, further comprising:

a second semiconductor die bonded over and electrically connected to the interconnect structure, wherein the second semiconductor die and the first semiconductor die are heterogeneous semiconductor dies.

11. The chip package structure as claimed in claim 8, wherein the second metal stiffener structure comprises:

a lower portion attached to the package substrate; and an upper portion attached to an upper surface of the lower portion, wherein the lower portion and the upper portion comprise different metal materials.

12. The chip package structure as claimed in claim 8, wherein the first metal stiffener structure comprises:

a spacer wall portion over the package substrate and surrounding the second semiconductor die; and a lid cap portion connected to an upper surface of the spacer wall portion, wherein the lid cap portion comprises copper and the spacer wall portion comprises a different material than copper.

13. The chip package structure as claimed in claim 12, wherein the spacer wall portion is welded to the lid cap portion.

14. A semiconductor device, comprising:

a plurality of semiconductor dies formed over a package substrate;

an interconnect structure bonded and electrically connected between the plurality of semiconductor dies and the package substrate;

a first metal stiffener structure formed over the package substrate and covering the plurality of semiconductor dies, wherein the first metal stiffener structure comprises:

a spacer wall portion over the package substrate and surrounding the plurality of semiconductor dies; and a lid cap portion connected to the spacer wall portion; and a second metal stiffener structure formed over the package substrate, surrounding the plurality of semiconductor dies, and surrounded by the spacer wall portion, wherein the second metal stiffener structure comprises:

a lower portion attached to the package substrate; and an upper portion attached to an upper surface of the lower portion, wherein a coefficient of thermal expansion (CTE) of each, the lower portion and the upper portion, is lower than a CTE of the lid cap portion.

15. The chip package structure as claimed in claim 14, wherein at least two of the plurality of semiconductor dies are homogeneous semiconductor dies.

16. The chip package structure as claimed in claim 14, wherein at least two of the plurality of semiconductor dies are heterogeneous semiconductor dies.

17. The chip package structure as claimed in claim 14, wherein the lid cap portion of the first metal stiffener structure has a thermal conductivity that is higher than a thermal conductivity of the spacer wall portion of the first metal stiffener structure and thermal conductivities of the lower and upper portions of the second metal stiffener structure.

18. The chip package structure as claimed in claim 14, wherein the CTE of the lid cap portion is higher than a CTE of the spacer wall portion.

19. The chip package structure as claimed in claim 1, wherein an upper surface and a lower surface of the metal lid cap portion are substantially and respectively level with an upper surface and a lower surface of the metal spacer wall portion, and the metal lid cap portion and the metal spacer wall portion are made of a same material layer.

20. The chip package structure as claimed in claim 8, wherein a top surface of the second metal stiffener structure is spaced apart from a bottom surface of a portion of the first metal stiffener structure formed over the second metal stiffener structure by the cavity.

* * * * *